(12) United States Patent
Holland et al.

(10) Patent No.: US 6,355,541 B1
(45) Date of Patent: Mar. 12, 2002

(54) METHOD FOR TRANSFER OF THIN-FILM OF SILICON CARBIDE VIA IMPLANTATION AND WAFER BONDING

(75) Inventors: Orin Wayne Holland, Lenoir City; Darrell Keith Thomas, Kingston, both of TN (US); Richard Bayne Gregory; Syd Robert Wilson, both of Phoenix, AZ (US); Thomas Allen Wetteroth, Chandler, AZ (US)

(73) Assignees: Lockheed Martin Energy Research Corporation, Oakridge, TN (US); Motorola, Inc., Tempe, AZ (US)

( * ) Notice: Subject to any disclaimer, the term of this patent is extended or adjusted under 35 U.S.C. 154(b) by 0 days.

(21) Appl. No.: 09/296,143

(22) Filed: Apr. 21, 1999

(51) Int. Cl.[7] .......................... H01L 21/46; H01L 21/30
(52) U.S. Cl. ..................................... 438/459
(58) Field of Search ............................. 438/455, 458, 438/460, 478, 459, 510, 520; 257/190

(56) References Cited

U.S. PATENT DOCUMENTS

| 5,374,564 | A |   | 12/1994 | Bruel |        |
|-----------|---|---|---------|-------|--------|
| 5,661,316 | A | * | 8/1997  | Kish, Jr. et al. | 257/190 |
| 6,150,239 | A | * | 11/2000 | Goesele et al. | 438/458 |
| 6,159,824 | A | * | 12/2000 | Henley et al. | 438/455 |
| 6,159,825 | A | * | 12/2000 | Henley et al. | 438/460 |
| 6,165,874 | A | * | 12/2000 | Powell et al. | 438/478 |
| 6,225,192 | B1 | * | 5/2001 | Aspar et al. | 438/260 |
| 6,245,161 | B1 | * | 6/2001 | Henley et al. | 148/33.4 |
| 6,246,068 | B1 | * | 6/2001 | Sato et al. | 257/3 |
| 6,251,754 | B1 | * | 6/2001 | Ohshima et al. | 438/506 |

OTHER PUBLICATIONS

Mahajan et al., Concise Encyclopedia of Semiconducting Materials & Related Technologies, Pergamon Press, pp. 452–453, 1992.*
Beyond "Smart–Cut": Recent Advances in Layer Transfer for Material Integration, Q–Y. Tong and R.W. Bower, MRS Bulletin, Dec. 998, pp. 40–44.
The History, Physics, and Applications of the Smart–Cut Process, Michel Bruel, MRS Bulletin, Dec. 1998, pp. 35–39.
Application of Hydrogen Ion Beams to Silicon on Insulator Material Technology, Michel Bruel, Nuclear Instruments and Methods in Physics Research B108, 1996, pp. 313–319.

* cited by examiner

*Primary Examiner*—Long Pham
*Assistant Examiner*—William David Coleman
(74) *Attorney, Agent, or Firm*—Fulbright & Jaworski

(57) ABSTRACT

Systems and methods are described for transfer of a thin-film via implantation, wafer bonding, and separation. A method for transfer of a thin-film, includes: implanting a source crystal with ions along a crystallographic channel and at a temperature of at least approximately 200° C. to i) form a strained region and ii) define the thin-film; then bonding a surface of the thin-film to a target wafer; and then separating a) the target wafer and the thin-film from b) a remainder of the source crystal along the strained region. The systems and methods provide advantages because the electrical carriers in the crystal, and consequently the thin-film, are not deactivated and the quality of the transferred thin-film is improved.

20 Claims, 5 Drawing Sheets

FIG. 1C Separation

FIG. 1B Bonding

FIG. 1A Implantation

METHOD FOR TRANSFER OF THIN-FILM OF SILICON CARBIDE VIA IMPLANTATION AND WAFER BONDING

BACKGROUND OF THE INVENTION

1. Field of the Invention

The invention relates generally to the field of blistering to form thin-films. The thickness of the film is determined by the penetration depth of the implanted ions which is nominally less than several microns. More particularly, the invention relates to an efficient method for transfer of thin-films of SiC utilizing lattice oriented implantation and wafer bonding.

2. Discussion of the Related Art

Thin films of silicon carbide can be cleaved or delaminated from a bulk crystal and transferred to another substrate utilizing implantation and wafer bonding. This process involves implantation of hydrogen into a bulk crystal to produce an implanted layer having a highly damaged (and strained) region near the mean range of the ions. This region can be denoted $R_p$. The bulk crystal (or the source substrate) is then bonded to another substrate, hereafter referred to as the target, and the bonded pair are then thermally cycled causing the implanted layer to delaminate at or near Rp. This delamination leaves the thin-film bonded to the target substrate as a continuous layer. This process is described in U.S. Pat. No. 5,374,564, the entire contents of which are incorporated by reference, and is known as "Smart-Cut". The implantation of hydrogen is done at room or ambient temperature along a random direction in the bulk single crystal to specifically suppress channeling of the ions in the channels or open spaces of the crystal lattice.

While the process described above has been successfully applied to silicon technology to produce high quality, silicon-on-insulator wafers, it has not been proven successful for the transfer of thin films of SiC of sufficient quality for device applications. A significant problem has been associated with the implantation step. Specifically, light ion implantation of bulk SiC has been shown to deactivate the electrical carriers in the SiC material, making it highly resistive over a depth consistent with the range of the implant. The high resistivity of the implanted SiC material persists even after high temperature annealing at approximately 1300 deg. C. Consequently, the transferred SiC layers have similarly been found to be highly resistive and, therefore, unusable for electronic device applications. Clearly, residual damage produced during hydrogen implantation deactivates or passivertes the carriers. What is needed, therefore, is a solution that permits thin-films of SiC to be transferred, while maintaining the electrical properties as possession in the bulk SiC.

Another problem that has been associated with the implantation step has been excessive roughness of the original and newly exposed (delaminated) thin film surface. What is also needed, therefore, is a solution that permits transfer of a thin film from SiC without the formation of an excessively rough surfaces on either side of the transferred film.

SUMMARY OF THE INVENTION

A primary goal of the invention is to provide the use of channeled light-ion (such as, for example, hydrogen or helium) implantation to form a highly strained layer within a single crystal. Another primary goal of the invention is to provide the implantation of light-ions along a random direction in a single-crystal at elevated temperatures.

In accordance with these goals, there is a particular need for channeled light-ion implantation and/or light-ion implantation along a random direction at elevated temperatures to form a highly strained layer within a crystal. Thus, it is rendered possible to satisfy the above-discussed requirement without degrading the electrical properties (e.g. deactivation of the electrical carriers) in the material, which, in the case of the prior art, cannot be satisfied.

A first aspect of the invention is implemented in an embodiment that is based on a method for transfer of a thin-film, comprising: implanting a source crystal with ions along a crystallographic channel of the source crystal to i) form a strained region and ii) define the thin-film; then bonding a surface of the thin-film to a target wafer; and then separating a) the target wafer and the thin-film from b) a remainder of the source crystal along the strained region. A second aspect of the invention is implemented in an embodiment that is based on a method for transfer of a thin-film, comprising: implanting a crystal with ions at an elevated temperature of at least approximately 200° C. to i) form a strained region and ii) define the thin-film; then bonding a surface of the thin-film to a target wafer; and then separating a) the target wafer and the thin-film from b) a remainder of the source crystal along the strained region. A third aspect of the invention is implemented in an embodiment that is based on combining the first aspect and the second aspect. A fourth aspect of the invention is implemented in an embodiment that is based on a thin-film comprising: a portion of a target wafer separated from a remainder of the target wafer at a strained region, wherein the target wafer possesses a set of electrical properties and the thin-film substantially maintains the set of electrical properties.

These, and other, goals and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters designate the same parts. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description of preferred embodiments. Descriptions of well known components and processing techniques are omitted so as not to unnecessarily obscure the invention in detail.

Overview

The context of the invention includes fabrication of thin films for semiconductor manufacture. The invention can also utilize data processing methods that transform signals from the sample (e.g. target crystal) being implanted so as to actuate interconnected discrete hardware elements; for example, to modulate the ion flux and/or change the channel of implantation.

The term coupled, as used herein, is defined as connected, although not necessarily directly, and not necessarily mechanically. The term substantially as used herein is defined as approximately equal to (preferably within 10% of, more preferably within 1% of, and most preferably within 0.1% of). The term thin-film as used herein is defined as a film having a thickness of less than several microns.

The invention involves a thin-film process which utilizes implantation and wafer bonding to affect the transfer of a thin film from one wafer to another. The invention includes all methods of implantation to make the process more efficient (i.e. lower the critical dose for wafer separation) and to improve the quality of the transferred film (i.e. eliminate or decrease ion-induced defects).

The invention includes channeled implantation of a bulk single-crystal along any crystallographic direction. In preferred embodiments the channeled implantation takes place along a direction that is substantially parallel to a major crystallographic direction. A major crystallographic axis is defined here as a direction perpendicular to a crystallographic plane. For example, the major crystallographic directions in hexagonal crystals are [1 0 0 0], [1 2 1 0], and [1 0 1 0]. However, the invention also includes implantation along a minor crystallographic direction.

The invention includes the channeled implantation of any crystal. Generally, this crystal can be termed a source crystal. In preferred embodiments, the channeled implantation takes place in a bulk single-crystal material. Although many of the embodiments described herein relate to channeled implantation of bulk single-crystal silicon carbide, the invention can be implemented with other bulk materials such as those that include silicon, germanium, silicon-germanium alloys, diamond, gallium nitride, gallium arsenide, aluminum nitride, strontium titanate, and alumina, and any combination thereof. The invention can also be implemented with non-single-crystal materials.

The invention includes random and/or channeled implantation of bulk single-crystal materials at elevated temperatures. The phrase elevated temperatures is defined herein to mean greater than room temperature (e.g., approximately 20° C.), preferably greater than approximately 100° C., more preferably greater than approximately 200° C. For example, elevated temperature implantation can take place at approximately 300° C., approximately 400° C., approximately 500° C., approximately 600° C., approximately 700° C., approximately 800° C., approximately 900° C., or higher temperatures.

First Embodiment

A first embodiment of the invention is based on the use of channeled light-ion implantation to effect the thin-film transfer process. This embodiment is depicted schematically in FIGS. 1A–1C.

Figure 1A:
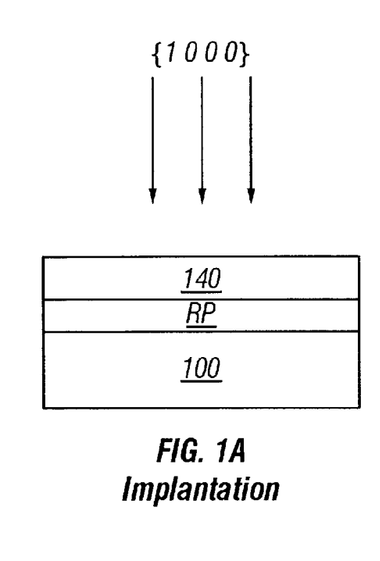
FIG. 1A illustrates a schematic view of a channeled implantation step, representing an embodiment of the invention.

FIG. 1A depicts light-ion implantation of a bulk SiC single-crystal 100 along the {1 0 0 0} direction. The light-ions can include hydrogen ions. A thin-film 140 is defined above a strained region $R_p$. Substrate 100 may include an epitaxial silicon carbide film with controlled impurity doping. Thin-film 140 is defined above the strained region Rp, both of which are included in the silicon carbide crystal 100.

Figure 1B:
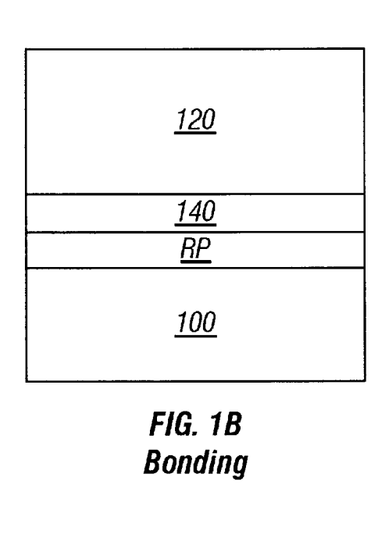
FIG. 1B illustrates a schematic view of a bonding step, representing an embodiment of the invention.

FIG. 1B illustrates the bulk SiC single-crystal 100 being bonded to a target wafer 120. To ensure good bonding, the single-crystal 100 and/or the target wafer 120 can be oxidized or deposited with a thin-film of silicon oxide. Any oxide coating on the single-crystal 100 should be applied after light-ion implantation to avoid scattering of the ions during channeling.

Figure 1C:
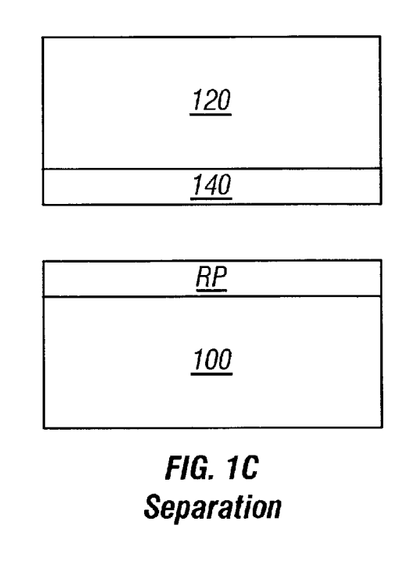
FIG. 1C illustrates a schematic view of a separation step, representing an embodiment of the invention.

FIG. 1C depicts separation when the bonded pair is cycled at high temperature e.g. one higher than the bonding temperature. This separation of target wafer 120 from single-crystal 100 occurs at or near $R_p$, thereby transferring the thin-film 140 to the target wafer 120.

Typically the newly exposed surface of the transferred film 140 is polished. This polishing can remove hydrogen retained in the film near $R_p$, as well as any damage at this location.

The bulk SiC single-crystal 100 can be prepared so that a major crystallographic direction (i.e. <1 0 0 0> for the hexagonal polytype) is normal to the surface. This is referred to as an "on-axis" cut. Alternatively, the single-crystal 100 may be cut with a slight angle between the major axis and the normal to the cleaved plane.

Alignment of the single-crystal 100 to ensure that the incident ions enter the lattice along a major crystallographic direction can be achieved by two methods. The first method involves monitoring backscattering of the ions. The second method involves optical alignment.

In the backscattering method, aligning the normal, or near-normal, crystal axis with the incident $H^+$ ions can be accomplished by monitoring backscattered hydrogen during implantation. This requires the crystal to be mounted on a mechanical stage such as a goniometer so that it can be oriented (relative to the incident ions) to minimize the backscattered yield. Since channeling suppresses the interaction between ions and the lattice atoms, this method of orienting the crystal ensures that the crystal is aligned with its major axis collinear with the incident ions. The backscattered yield can be detected using a standard silicon solid-state detector with the associated electronics.

In the optical alignment method, an "on-axis" wafer is aligned so that the surface normal is collinear with the incident ions, thereby ensuring that the ions will be channeled. A laser light can be reflected off the sample. The light is directed along the centerline of the beam tube (so that it is collinear with the ions) to the sample. The sample is then oriented to back reflect the laser light onto itself.

Channeling is found to benefit the process in a number of ways. One aspect of the invention involves the deliberate use of channeled, hydrogen-ion implantation to effect the thin-film transfer. Conventional wisdom teaches that channel-ion implants are deleterious because they result in a substantial spreading in the implant profile so that control of the implant profile is compromised. This control is vitally important for dopant ion implantation used in fabrication of integrated circuits. Channeling implants for affecting wafer cleaving do not require the same degree of control as for doping applications. All that is necessary is a sufficient combination of hydrogen and ion-induced damage near the ion's range to produce the stress necessary to laterally cleave the wafer.

Channeled ions do not interact strongly with the lattice atoms, especially in the near-surface ahead of the ion range, so that atomic displacements within the lattice are reduced. Minimizing the amount of damage produced by implantation is a critical factor in ensuring that the transferred layer is of high quality.

Figure 2A:
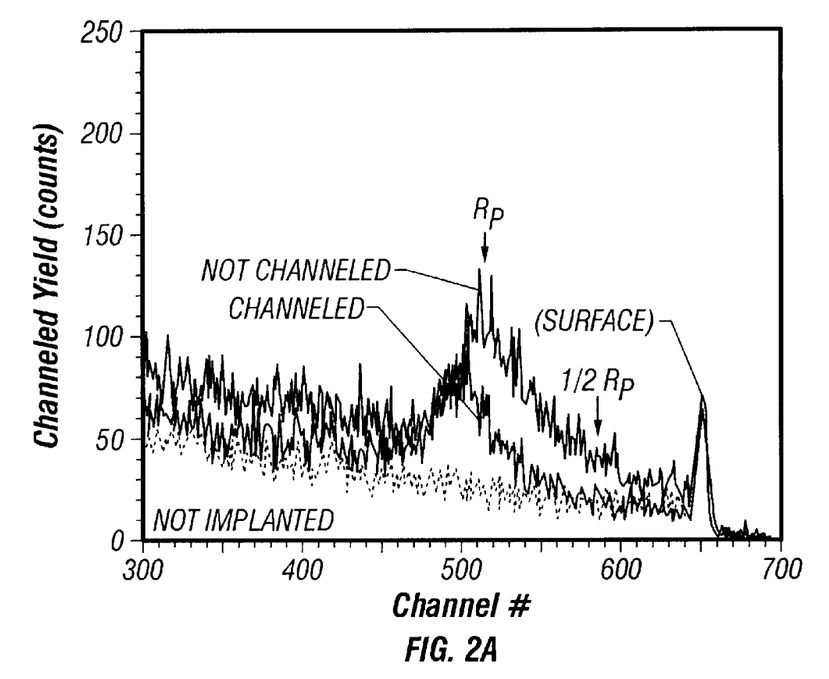
FIG. 2A illustrates Rutherford spectra showing the aligned backscattering yield as a function of depth for silicon carbide samples that were not implanted, implanted but not channeled, and implanted and channeled, representing an embodiment of the invention.
Figure 2B:
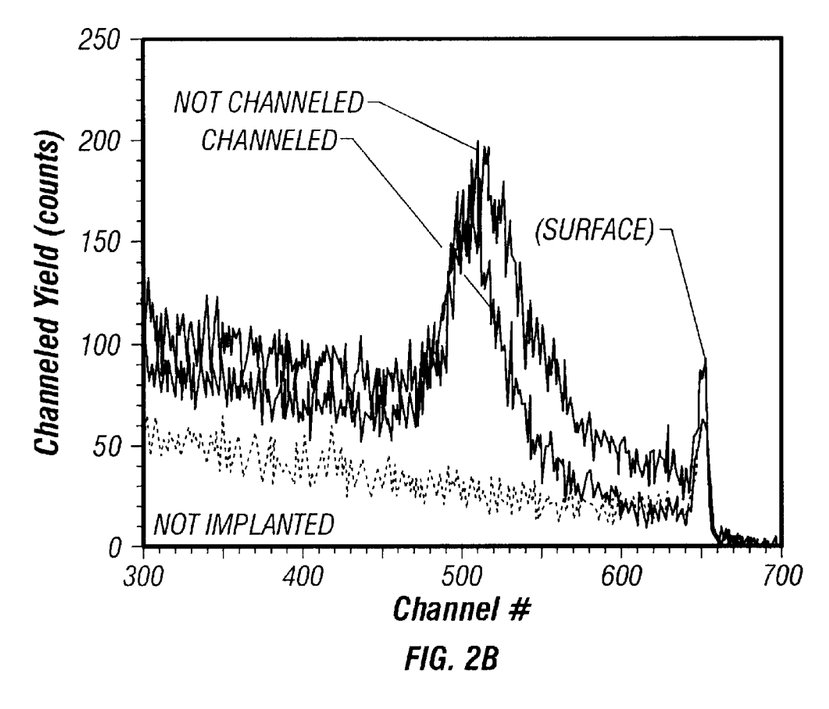
FIG. 2B illustrates Rutherford spectra showing the aligned backscattering yield as a function of depth for silicon carbide samples that were not implanted, implanted but not channeled, and implanted and channeled, representing an embodiment of the invention.

FIGS. 2A and 2B show Rutherford backscattering data from silicon carbide samples which were implanted with $H^+$ ions at 60 keV at two different doses: $2\times10^{16}$ cm$^{-2}$ and $4\times10^{16}$ cm$^{-2}$. For each comparison, samples were implanted either along a major crystallographic direction (and therefore underwent a channeled implantation) or were implanted along a random direction in the lattice.

The spectra shown in FIGS. 2A–2B were acquired utilizing a backscattering configuration in which the analysis beam was channeled. This enables determination of the amount of implantation damage that was done by the respective implantations. To a first order approximation, the amount of the scattering yield (compared to that from a sample that has not been implanted) yields the relative damage in the sample.

The scattering yield at the sample surface is indicated in FIGS. 2A and 2B as a peak toward the right of the traces. The yield below the surface (at lower channels) marks scattering from deeper within the sample. The end-of-range of the ions (approximately where the scattering yield is greatest) is marked within the figure as $R_p$. Halfway between the end-of-range and the surface is marked as $\frac{1}{2} R_p$. The damage at $\frac{1}{2} R_p$ is a figure of merit since this essentially measures the quality of the transferred thin film. Any damage, if it occurs, near $R_p$ can be removed after transfer by a mechanical/chemical polish. It is clear that at both implantation doses, the damage (as measured by the relative scattering yield) is lower for the channeled implant than the random implant. An unexpected advantageous aspect of the invention is that it is able to utilize this benefit of channeling to minimize lattice damage without suffering an unacceptable loss of control of the implant profile.

It can be appreciated that the amount of damage produced by the implantation increases with the ion dose. To reduce the damage and make the process more efficient, it is important to optimize the implantation to decrease the amount of hydrogen needed to effect the thin-film transfer. The minimum amount of implantation to effect thin-film transfer can be termed the critical dose.

The critical dose can be monitored by noting the onset of exfoliation in implanted bulk SiC. Exfoliation occurs in bulk SiC when the stress produced by the implanted hydrogen is sufficient to cause blistering and subsequent cratering of the surface. These craters are formed by eruptions within the lattice, due to the trapped hydrogen gas, that blow out large chunks of material leaving holes or craters in the surface. The physical mechanism underlying the exfoliation phenomenon (i.e. behavior of hydrogen in the lattice) is also responsible for the lateral cleavage during thin-film transfer in bonded wafers. In a bonded configuration, the wafer is constrained by its bonded pair so that the stress in the lattice can only be relieved by laterally cracking or cleaving. An unbound bulk wafer is not similarly constrained so that the high strain produced by hydrogen implantation is relieved by exfoliation.

Figure 3:
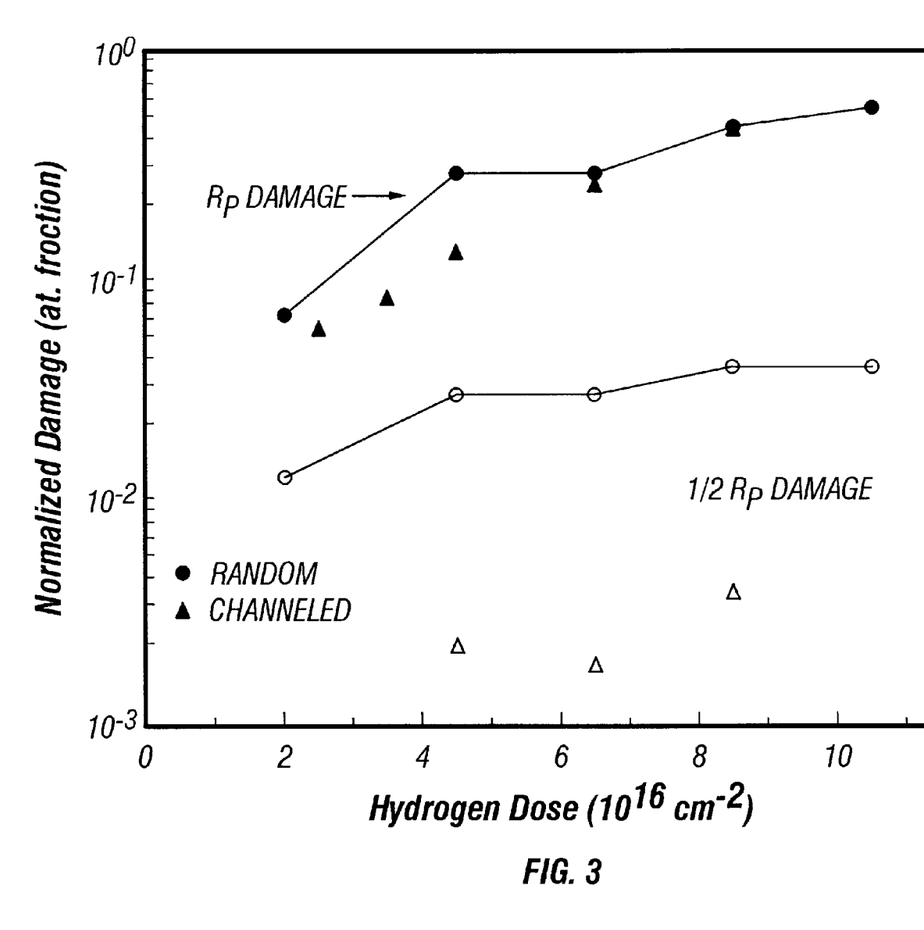
FIG. 3 illustrates normalized damage near $R_p$ and ½ $R_p$ as a function of hydrogen dose (hydrogen implantation) for silicon carbide samples that were implanted but not channeled and implanted and channeled, representing embodiments of the invention.

FIG. 3 compares the lattice damage at two locations, $R_p$ and $\frac{1}{2} R_p$ over a wide range of doses for random and channeled implants. The damage was determined by a Rutherford backscattering analysis using standard manipulation to extract quantitative values. Again, a value of merit is that for the $\frac{1}{2} R_p$ location. It is clear that over the entire range of dose, the channeled implants yield greater than an order of magnitude less damage than the random implants. Also, it should be noted that below the critical dose for channeled implantation ($\sim 3.25\times10^{16}$ cm$^{-2}$), no damage at $\frac{1}{2} R_p$ was measured in the samples implanted by channeling.

The amount of hydrogen retained in the lattice during high-temperature cycling (at 1200° C.) is substantially more for channeled implants than random implants. The reason for this may be due to the fact that the as-implanted profile of the hydrogen is more strongly peaked than the random profile. This may explain in part why the critical dose is smaller for a channeled implant. In addition, the higher retained dose is important because it will prevent hydrogen diffusion within the thin-film where it can form hydrogen-related defects (i.e. platelets and voids). In the conventional process (using random implants) hydrogen diffusion with the thin-film results in the formation of voids which have a deleterious effect upon the quality of the material (i.e. reliability).

Second Embodiment

A second embodiment of the invention is based on high-temperature processing of the wafers. If the implantation is done at high-temperature (e.g. 600° C.), a substantial reduction of the critical dose, as well as ion-induced damage occurs compared to room-temperature (e.g. 20° C.) processing.

In the case of SiC, implantation at an elevated temperature of approximately 600° C. reduces the critical dose by nearly a factor of 2, from $4.5\times10^{16}$ cm$^{-2}$ per square at room-temperature to $2.8\times10^{16}$ cm$^{-2}$ per square. The retained fraction of hydrogen in the sample implanted at 600° C. is higher by about a factor of 2 than in room-temperature samples (after cycling 1200° C.). This reduces the amount of hydrogen diffusing within the thin-film so that void formation is suppressed.

Of course the invention is not limited to SiC. Any crystal targets can be used. The crystal targets can be held at approximately 300° C., approximately 400° C., approximately 500° C., approximately 600° C., approximately 700° C., approximately 800° C., approximately 900° C., or higher, during implantation.

Figure 4A:
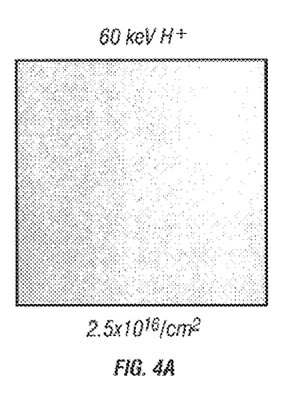
FIGS. 4A–4C illustrate images of silicon carbide samples that were channel implanted, representing embodiments of the invention.
Figure 4B:
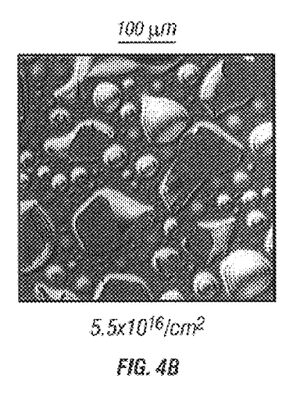
Figure 4C:
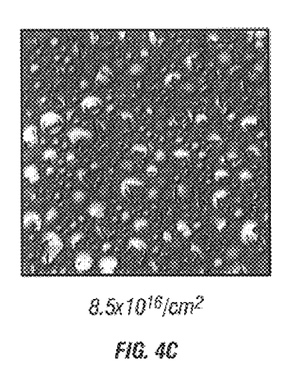

FIGS. 4A–4C show a series of optical micrographs from SiC samples implanted at room-temperature with 60 keV H+-ions, and then subsequently annealed at approximately 950° C. This analysis shows that the lower dose ($2.5 \times 10^{16}$ cm$^{-2}$) is below the critical fluence needed for exfoliation under these circumstances, while the $5.5 \times 10^{16}$ cm$^{-2}$ dose is sufficient for exfoliation. Together, FIGS. 4A–4C show retrograde dependence on the H+ dose.

Figure 5A:
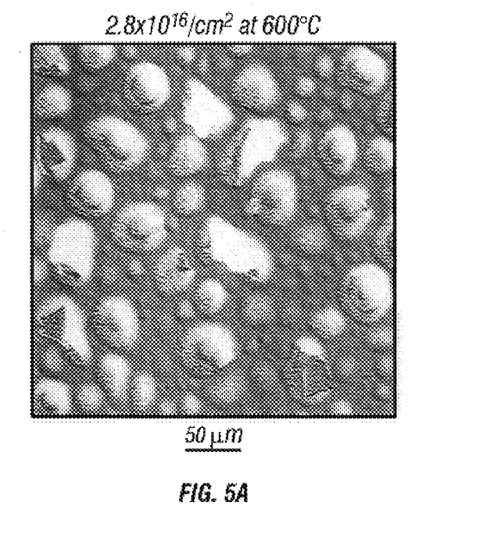
FIGS. 5A–5B illustrate silicon carbide samples that were hot implanted, representing embodiments of the invention.
Figure 5B:
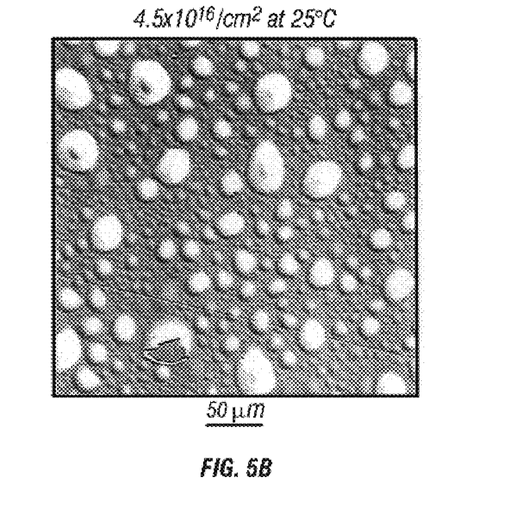

FIGS. 5A and 5B demonstrate how doing implantations at elevated temperatures (hot implants) can lower the critical fluence for exfoliation (and therefore thin-film transfer). For 600° C. random implantations, the critical fluence is reduced to approximately $2.8 \times 10^{16}$ cm$^{-2}$.

Third Embodiment

A third embodiment of the invention is based on a combination of both the first embodiment and the second embodiment (i.e. channeled-ion implantation at elevated temperatures). This allows the use of a lower dose and thus less chance of producing lattice damage. In the case of a silicon carbide crystal, this combination approach further reduces the critical dose to approximately $2.5 \times 10^{16}$ cm$^{-2}$.

While not being limited to any particular performance indicator or diagnostic identifier, preferred embodiments of the invention can be identified one at a time by testing for the presence of a narrow region of strain (Rp). The test for the presence of narrow Rp can be carried out without undue experimentation by the use of a simple and conventional Rutherford backscattering experiment. Another way to seek embodiments having the attribute of a narrow region of strain is to test for the presence of smooth topography after thin-film transfer.

Practical Applications of the Invention

A practical application of the invention that has value within the technological arts is the fabrication of electronic or optical components, such as, for example, semiconductor substrates. Further, the invention is useful in conjunction with preparation of wide bandgap substrates for fabrication of power drives. There are virtually innumerable uses for the invention, all of which need not be detailed here.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the thin films need not be fabricated from the disclosed materials, but could be fabricated from virtually any suitable materials. Further, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A method for transfer of a thin-film, comprising;
   implanting a source crystal with ions along a crystallographic channel of the source crystal to i) form a strained region and ii) define the thin-film; then
   bonding a surface of the thin-film to a target wafer; and then
   separating a) the target wafer and the thin-film from b) a remainder of the source crystal along the strained region.

2. The method of claim 1, wherein the crystallographic channel is substantially parallel to a major crystal direction of the source crystal.

3. The method of claim 2, wherein the source crystal composes a hexagonal crystal and the major crystal direction is selected from the group consisting of [1 0 0 0], [1 2 1 0], and [1 0 1 0].

4. The method of claim 1, wherein the thin-film includes at least one member selected from the group consisting of SiC, Si, Ge, SiGe alloys diamond, GaN, GaAs, AlN, SrTiO$_3$, and Al$_2$O$_3$.

5. The method of claim 1, wherein the ions include hydrogen ions.

6. The method of claim 1, wherein implanting includes implanting at an elevated temperature of at least approximately 200° C.

7. A method for transfer of a thin-film, comprising:
   implanting a source crystal with ions along a crystallographic channel of the source crystal to i) form a strained region and ii) define the thin-film; then
   bonding a surface of the thin-film to a target wafer; and then
   separating a) the target wafer and the thin-film from b) a remainder of the source crystal along the strained region,
   wherein the method includes monitoring backscattering of the ions to align the crystal relative to a source of light-ions.

8. A method for transfer of a thin-film, comprising:
   implanting a source crystal with ions along a crystallographic channel of the source crystal to i) form a strained region and ii) define the thin-film; then
   bonding a surface of the thin-film to a target wafer; and then
   separating a) the target wafer and the thin-film from b) a remainder of the source crystal along the strained region,
   wherein the method includes aligning the crystal relative to a source of light-ions by reflecting a laser beam that is substantially parallel to a channeling direction.

9. The method of claim 1, further comprising aligning the crystal relative to a source of light-ions along a major crystallographic direction in the source crystal to minimize roughening during implantation.

10. A thin-film transferred according to the method of claim 1.

11. A method for transfer of a thin-film, comprising:
    implanting a source crystal with ions at an elevated temperature of at least approximately 200° C. to i) form a strained region and ii) define the thin-film; then
    bonding a surface of the thin-film to a target wafer; and then
    separating a) the target wafer and the thin-film from b) a remainder of the source crystal along the strained region, wherein implanting includes implanting the source crystal with ions along a crystallographic channel of the source crystal.

12. The method of claim 11, wherein the source crystal includes at least one member selected from the group consisting of SiC, Si, Ge, SiGe alloys diamond, GaN, GaAs, AlN, $SrTiO_3$, and $Al_2O_3$.

13. The method of claim 11, wherein the ions include hydrogen ions.

14. The method of claim 11, wherein the crystallographic channel is substantially parallel to a major crystal direction of the source crystal.

15. The method of claim 14, wherein the source crystal composes a hexagonal crystal and the major crystal direction is selected from the group consisting of [1 0 0 0], [1 2 1 0], and [1 0 1 0].

16. The method of claim 11, further comprising polishing an exposed surface of the source crystal.

17. A thin-film transferred according to the method of claim 11.

18. A method for transfer of a thin-film, comprising:

implanting a source crystal with ions along a crystallographic channel of the source crystal and at a temperature of at least approximately 300° C. to i) form a strained region and ii) define the thin-film; then bonding a surface of the thin-film to a target wafer; and then separating a) the target wafer and the thin-film from b) a remainder of the single crystal along the strained region.

19. A thin-film transferred according to the method of claim 18.

20. The method of claim 18, wherein the crystallographic channel is substantially parallel to a major crystal direction of the source crystal.

* * * * *